United States Patent
Shim

(10) Patent No.: US 12,369,460 B2
(45) Date of Patent: Jul. 22, 2025

(54) DISPLAY DEVICE

(71) Applicant: LG Display Co., Ltd., Seoul (KR)

(72) Inventor: Seokho Shim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 368 days.

(21) Appl. No.: 17/112,758

(22) Filed: Dec. 4, 2020

(65) Prior Publication Data

US 2021/0202658 A1     Jul. 1, 2021

(30) Foreign Application Priority Data

Dec. 30, 2019     (KR) ......................... 10-2019-0177573

(51) Int. Cl.
| | | |
|---|---|---|
| *H10K 59/131* | (2023.01) | |
| *H10K 59/124* | (2023.01) | |
| *H10K 59/80* | (2023.01) | |
| *H10K 77/10* | (2023.01) | |
| *H10K 102/00* | (2023.01) | |

(52) U.S. Cl.
CPC ......... *H10K 59/124* (2023.02); *H10K 59/131* (2023.02); *H10K 59/873* (2023.02); *H10K 59/8731* (2023.02); *H10K 77/111* (2023.02); *H10K 2102/311* (2023.02)

(58) Field of Classification Search
CPC .......... H10K 59/10–221; H01L 27/124; H01L 27/1244; H01L 27/32; H10D 86/441; H10D 86/443
See application file for complete search history.

(56) References Cited

U.S. PATENT DOCUMENTS

| | | | |
|---|---|---|---|
| 2008/0309232 A1* | 12/2008 | Yamamoto | H10K 50/852 313/505 |
| 2015/0144940 A1* | 5/2015 | Hong | H01L 27/1225 438/18 |
| 2018/0210305 A1* | 7/2018 | Gao | G09G 3/006 |
| 2019/0115400 A1* | 4/2019 | Park | G09G 3/3258 |
| 2020/0395419 A1* | 12/2020 | Kim | H10K 59/88 |

\* cited by examiner

*Primary Examiner* — Lauren R Bell
(74) *Attorney, Agent, or Firm* — Seed IP Law Group LLP

(57) ABSTRACT

Provided is a display device. The display device includes a substrate that includes an active area and an inactive area adjacent the active area. The display device includes a thin-film transistor that is disposed in the active area and includes a semiconductor layer and a first electrode. The display device further includes a first pad that is disposed in the inactive area and includes a first pad electrode. The first electrode and the first pad electrode are formed of the same material.

22 Claims, 10 Drawing Sheets

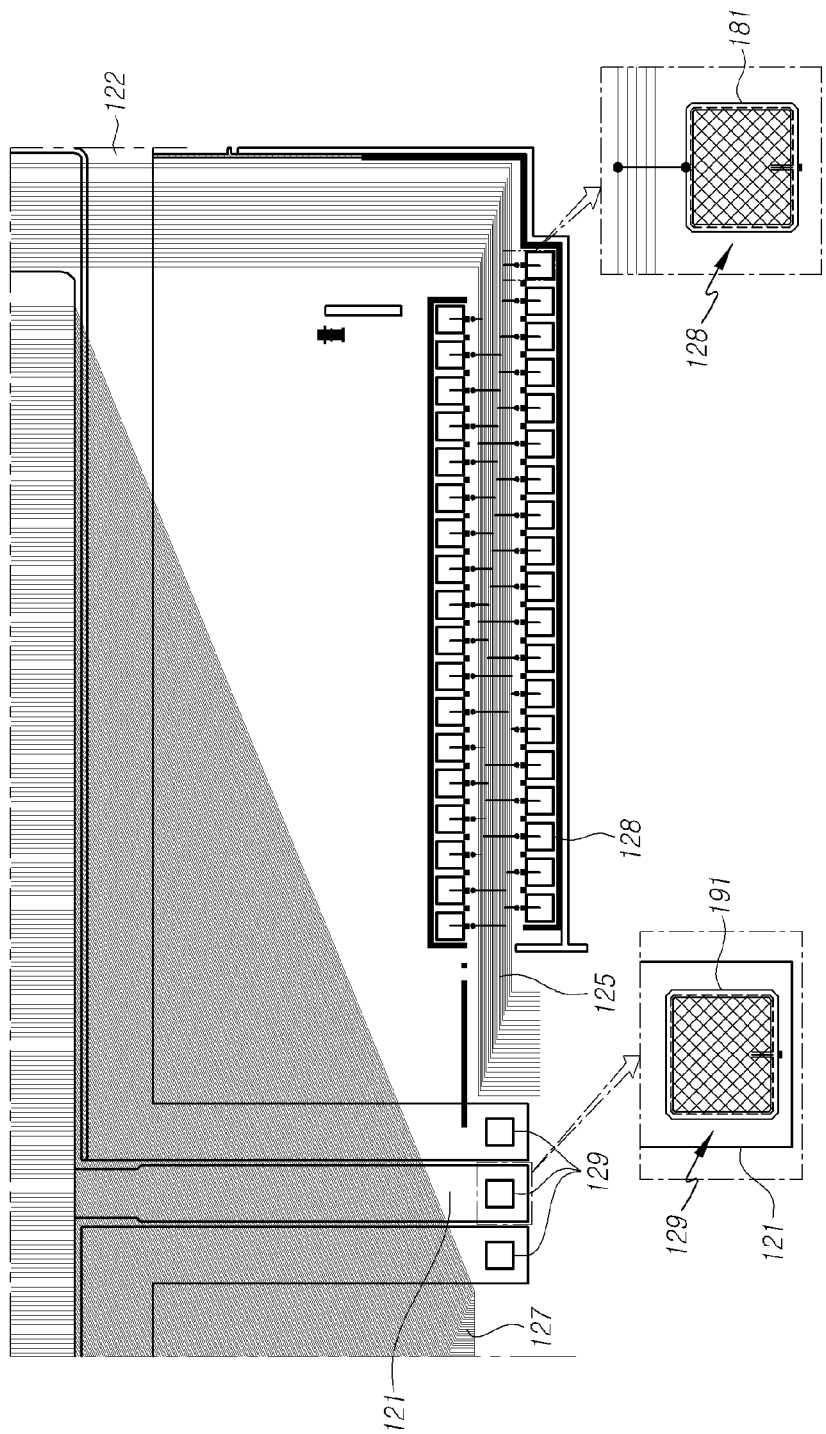

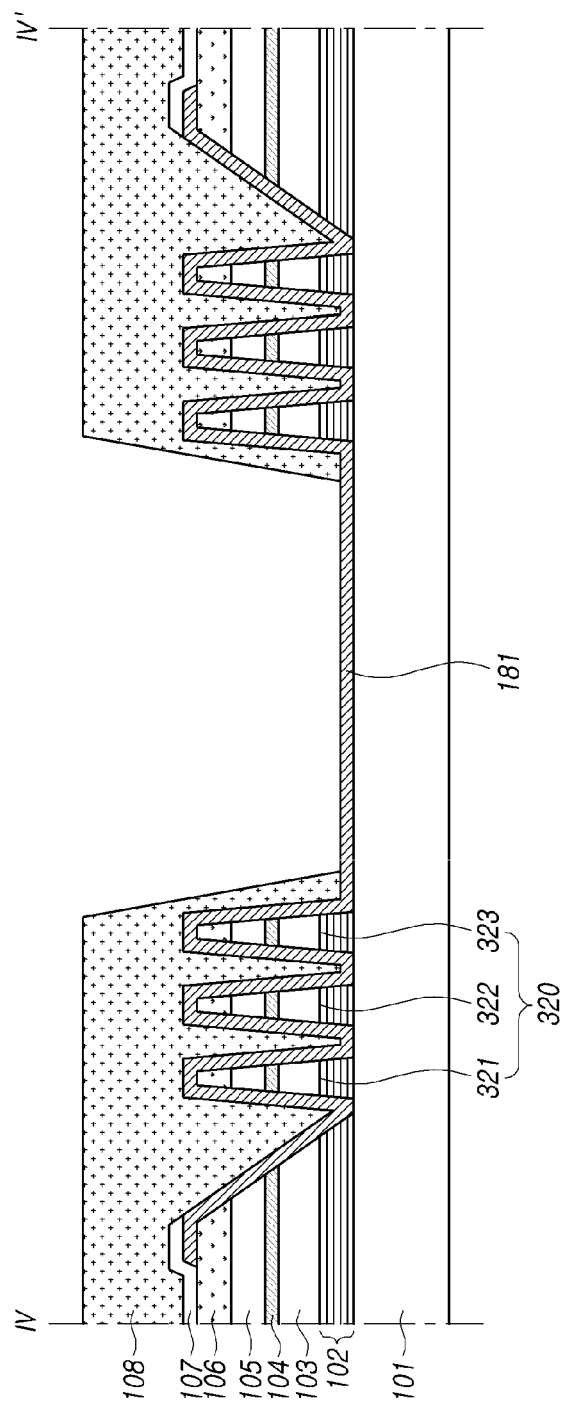

DISPLAY DEVICE

CROSS REFERENCE TO RELATED APPLICATION

This application claims priority from Korean Patent Application No. 10-2019-0177573, filed on Dec. 30, 2019, which is hereby incorporated by reference for all purposes as if fully set forth herein.

BACKGROUND

Technical Field

Embodiments of the present disclosure relate to a display device and more particularly to a display device that can prevent infiltration of external moisture and oxygen.

Description of the Related Art

With recent advancement in information-oriented societies, the field of displays that visually express electrical information signals has advanced rapidly and various display devices with excellent performance such as a decrease in thickness, weight, and power consumption have been developed according thereto.

Examples of a display device include a liquid crystal display device (LCD), an organic light emitting display device (OLED), and a quantum dot display device.

Among these display devices, a spontaneous light-emitting element such as an organic light emitting display device which does not require a particular light source is considered as a competitive application for compactness of the device and vivid color display. The display device includes an element that spontaneously emits light in each subpixel, and each light emitting element includes two electrodes facing each other and a light emitting layer that is disposed between the two electrodes and emits light when electrons and holes transported thereto are recombined. The display device may further include a display panel and a plurality of components for providing various functions. For example, one or more display drive circuits for controlling the display panel may be included in a display assembly. Examples of the drive circuits include gate drivers, emission (source) drivers, a power (VDD) routing, electrostatic discharge (ESD) circuits, multiplex (MUX) circuits, data signal lines, cathode contacts, and other functional elements. A plurality of peripheral circuits for providing various types of additional functions, for example, a touch sensing function and a fingerprint identification function, may be included in the display assembly. Some components may be disposed on the display panel and other components may be disposed on a film or a circuit board disposed outside the display panel.

An organic light emitting element is a spontaneous light-emitting element using a light emitting layer between electrodes and can be decreased in thickness. Since an organic light emitting device is embodied without using a particular light source, the organic light emitting device can be easily embodied as a flexible, bendable, or foldable display device and designed in various forms.

BRIEF SUMMARY

While the organic light emitting display device possess many beneficial features, these devices including spontaneous light-emitting elements are very weak at permeation of external, foreign materials such as oxygen, moisture or the like. The inventors of the present disclosure have realized that when external oxygen or moisture reacts with an organic layer of a light emitting element through fine cracks or the like which generated in the display device, a subpixel may become a dark spot or cause a defect such as reduction of pixels. Accordingly, the inventors have appreciated that it is beneficial to decrease the cracks which can be formed in the periphery of the display device.

Having realized these technical issues present in the related art, the present disclosure is made to solve the above problems such that there is no insulating film under an electrode for an inspection pad. When an insulating layer formed of an inorganic material or an organic material is disposed under an electrode for an inspection pad, cracks may be formed in the insulating layer due to a force or a load when a probe pin of lighting inspection equipment comes into contact with an inspection pad. External moisture or oxygen may permeate the display device through the cracks formed in the inspection pad.

A phenomenon in which inorganic insulating layers disposed in the periphery of an inspection pad are separated due to an impact from a probe pin which comes into contact therewith at the time of inspection can occur.

In order to solve these problems, the present disclosure provides a display device to which a member for allowing the display device to endure vibration and impacts which are generated in a vehicle is applied.

According to an embodiment of the present disclosure, there is provided a display device including: a substrate that includes an active area and an inactive area surrounding the active area; a thin-film transistor that is disposed in the active area and includes a semiconductor layer and a first electrode; and a first pad that is disposed in the inactive area.

In the display device according to the embodiment of the present disclosure, the first pad may include a first pad electrode, and the first electrode and the first pad electrode may be formed of the same material.

According to an embodiment of the present disclosure, there is provided a display device including: a substrate that includes an active area and an inactive area surrounding the active area; a thin-film transistor that is disposed in the active area; a first inspection pad and a second inspection pad that are disposed in the inactive area; and a planarization layer that covers the active area and at least a part of the inactive area In the display device according to the embodiment of the present disclosure, the first inspection pad includes a first electrode, the second inspection pad includes a second inspection electrode, the thin-film transistor includes a first electrode, and the planarization layer covers at least a part of the first inspection electrode and the second inspection electrode.

Other details of embodiments are described in the following detailed description and the accompanying drawings.

In the display device according to the embodiments of the present disclosure, an insulating film is not disposed under an electrode for an inspection pad such that cracks are not formed in a lighting inspection pad at the time of lighting inspection for decreasing a defect. When an insulating layer formed of an inorganic material or an organic material is disposed under an electrode for an inspection pad, cracks may be formed in the insulating layer due to a force or a load when a probe pin of lighting inspection equipment comes into contact with the inspection pad. External moisture or oxygen may permeate the display device through the cracks formed in the inspection pad. The pad electrode can be formed by removing the insulating layer under the pad to prevent such cracks.

According to the embodiment of the present disclosure, since the periphery of an inspection pad is covered by the planarization layer, an inorganic insulating layer such as a passivation layer or a first interlayer insulating layer which is disposed on a side surface of a pad can be protected such that it does not come into direct contact with a probe pin or is not detached due to impacts.

According to the embodiment of the present disclosure, even when a probe pin comes into contact with a position separated from the pad center, the probe pin can be rearranged to the pad center due to the planarization layer.

Technical benefits of the present disclosure are not limited to the above and other benefits which are not mentioned above can be apparently understood from the following description by those skilled in the art.

BRIEF DESCRIPTION OF THE SEVERAL VIEWS OF THE DRAWINGS

FIG. 2 is an enlarged plan view of Area A in FIG. 1;

FIG. 7 is a sectional view illustrating another example of the first pad; and

DETAILED DESCRIPTION

Figure 1:
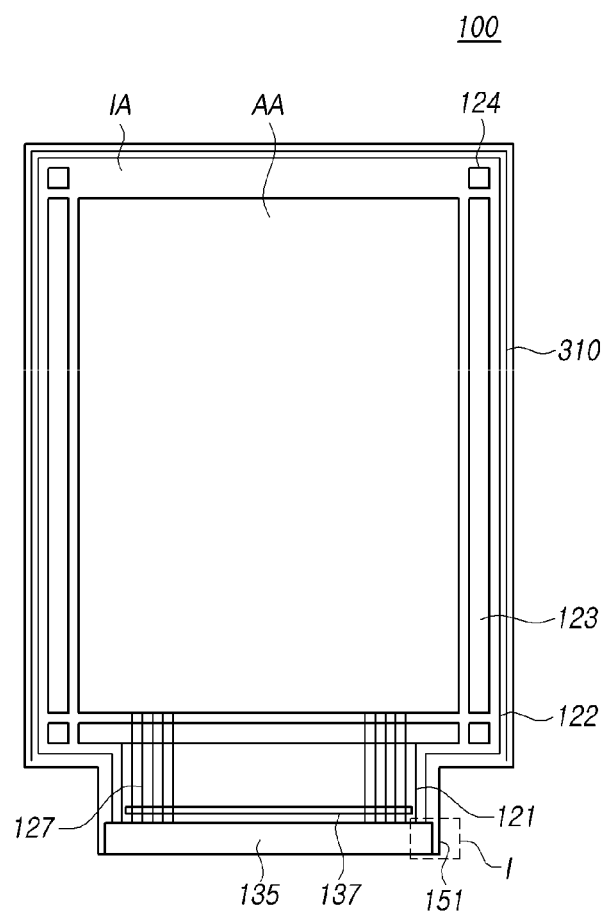
FIG. 1 is a plan view illustrating a front surface of a display device.

Advantages and features of the present disclosure and methods for achieving the advantages or features will be apparent from embodiments described below in detail with reference to the accompanying drawings. However, the present disclosure is not limited to the embodiments but can be modified in various forms. The embodiments are provided merely for completing the disclosure of the present disclosure and are provided for completely informing those skilled in the art of the scope of the present disclosure.

Shapes, sizes, ratios, angles, number of pieces, and the like illustrated in the drawings, which are provided for the purpose of explaining the embodiments of the present disclosure, are used as examples and thus the present disclosure is not limited to the illustrated details. In the following description, like elements are referenced by like reference numerals. When it is determined that detailed description of the relevant known functions or configurations involved in the present disclosure makes the gist of the present disclosure obscure, the detailed description thereof will not be made. When "include," "have," "be constituted," and the like are mentioned in the specification, another element may be added unless "only" is used. A singular expression of an element includes two or more elements unless differently mentioned.

In construing elements, an error range is included even when explicit description is not made.

For example, when positional relationships between two parts are described using 'on,' 'over,' and the like, one or more other parts may be disposed between the two parts unless 'just' or 'direct' is used.

In describing temporal relationships, for example, when the temporal order is described using 'after,' 'subsequent,' and 'before,' a case which is not continuous may be included unless 'just' or 'direct' is used.

It will be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the present disclosure.

Terms such as first, second, A, B, (a), and (b) can be used to describe elements of the present disclosure. These terms are merely used to distinguish one element from another element and the essence, order, sequence, number, or the like of the elements is not limited to the terms. If it is mentioned that an element is "linked," "coupled," or "connected" to another element, it should be understood that the element can be directly coupled or connected to another element or still another element may be "interposed" therebetween or the elements may be "linked," "coupled," or "connected" to each other with still another element interposed therebetween.

A "display device" in this specification may be a display device in a narrow sense such as a liquid crystal display module (LCM), an organic light emitting display module (OLED module), or a quantum dot display module including a display panel and a drive unit that drives the display panel. The display device may also be a notebook computer, a television, or a computer monitor which is a complete product or a final product including an LCM, an OLED module, or a QD module, an equipment display such as an automotive display or another form of a vehicle, or a set electronic device or a set device (or a set apparatus) such as a mobile electronic device such as a smartphone or an electronic pad.

Accordingly, a display device in this specification may be a display device in a narrow sense such as an LCM, an OLED module, or a QD module or an application product or a set device which is a final consumer device including an LCM, an OLED module, or a QD module.

In some cases, an LCM, an OLED module, or a QD module including a display panel and a drive unit may be referred to as a "display device" in a narrow sense and an electronic device which is a complete product including an LCM, an OLED module, or a QD module may be separately referred to as a "set device." For example, a display device in a narrow sense may include a display panel such as an LCD panel, an OLED panel, or a quantum dot display panel and a source PCB which is a controller for driving the display panel, and a set device may further include a set PCB which is a set controller that is connected to a source PCB and controls the set device as a whole.

A display panel which is used in an embodiment can employ all types of display panels such as an LCD panel, an OLED display panel, a QD display panel, and an electroluminescent display panel, and the present disclosure is not limited to a specific display panel in which a bezel can be bent with a flexible substrate for an OLED display panel and a back-plate support structure according to an embodiment.

A display panel which is used for a display device according to an embodiment in this specification is not limited to the shape or size of the display panel.

For example, when a display panel is an OLED display panel, the display panel includes a plurality of gate lines, a plurality of data lines, and pixels which are formed adjacent to overlapping locations between the gate lines and the data lines. The display panel includes an array including a thin-film transistor which is an element that selectively applies a voltage to each pixel, an OLED layer on the array, and an encapsulation substrate or an encapsulation layer that is disposed on the array to cover an OLED layer. The encapsulation layer can protect the thin-film transistor and the OLED layer from external impacts and prevent moisture or oxygen from permeating the OLED layer. A layer which is formed on the array can include an inorganic light emitting layer such as a nano-sized material layer or quantum dots.

According to an embodiment, FIG. 1 illustrates an OLED display panel 100 which may be incorporated into display devices.

FIG. 1 is a diagram illustrating a plan view of a display panel according to an embodiment of the present disclosure. FIG. 1 illustrates an OLED display panel 100 which may be incorporated into display devices. Referring to FIG. 1, the OLED display panel 100 includes at least one active area AA in which light emitting elements and an array for driving the light emitting elements are formed.

The display panel 100 includes an inactive area IA that is disposed in the peripheral part of the active area AA. An area surrounding the active area AA in all directions is the inactive area IA. The active area AA is rectangular, but various shapes of display devices such as a circle, an ellipse, and a polygon can be applied to smart watches or display devices for a vehicle. Accordingly, the arrangement of the inactive area IA surrounding the active area AA is not limited to the OLED display panel 100 illustrated in FIG. 1. Various components for driving light emitting elements and arrays which are formed in the active area AA are located in the inactive area IA on the right and left sides of the active area AA and provide functions for stable emission of light. Examples thereof include circuits such as gate-in-panel (GIP) 123 and electrostatic discharge (ESD) 124, areas for contact between cathodes which are parts of light emitting elements and low-potential voltage (VSS) lines 122 which are voltage reference points of the light emitting elements, and a plurality of dam structures for preventing a foreign substance compensation layer from overflowing to the outside of the display panel 100 during application of the foreign substance compensation layer in an encapsulation layer for protecting the light emitting elements from external moisture or foreign substances. A crack stopper structure 310 for preventing cracks which may be formed in a scribing step of dividing a mother substrate into display panels 100 from permeating the display panels 100 can be provided.

The crack stopper structure 310 can prevent an impact occurring in a trimming line of a substrate 101 from reaching the GIP 123, the ESD 124, or the low-potential voltage (VSS) lines 122 formed in the inactive area IA and breaking them in a scribing step or from providing a moisture permeation path to a light emitting element or an array formed in the active area AA such that a dark spot grows or pixel shrinkage occurs.

The crack stopper structure 310 is formed of an inorganic film or an organic film and has a multi-layered structure of an inorganic film and an organic film, but is not limited thereto. In FIG. 1, the crack stopper structure 310 is disposed on both long sides and only one short side of the display panel 100, but is not limited thereto. For example, the crack stopper structure 310 may also be disposed in a bending area and an area in which a notch 151 is formed and disposed on the overall periphery of the substrate 101.

In an area adjacent to a scribing line of the substrate 101 which is outside the crack stopper structure 310, some or all of insulating layers (such as a GI and a buffer layer) which are formed at the time of forming the active area AA can be etched. A small amount of insulating layers are left on the top of the substrate 101 or the top surface of the substrate is completely exposed through the etching such that a scribing impact is not transmitted to the insulating layers.

Referring to FIG. 1, an FPCB that is electrically connected to pads 135 which are formed to receive an external source voltage, a data drive signal, or the like or to transmit and receive touch signals is disposed in a lower area of the display panel 100. A high-potential voltage (VDD) line 121, a low-potential voltage (VSS) line 122, and/or data voltage lines 127 that extend from the FPCB are provided.

The data voltage lines 127 are disposed close to and connected to a data driver IC 137 that generates an emission signal of light emitting element 112.

The area in which the pads 135 and the data driver IC 137 are disposed is a second component formation portion. Parts of the high-potential voltage (VDD) line 121 and the low-potential voltage (VSS) line 122 are disposed in the second component formation portion.

Referring to FIG. 1, in the display panel according to an embodiment of the present disclosure, notches 151 are formed for bending a bending area by cutting both lower corners of the display panel 100 as indicated by a dotted line.

For example, when a scribing step of dividing a moth substrate into individual display panels is performed, the notches 151 are formed such that the scribing line is adjacent to the high-potential voltage (VDD) line 121 or the low-potential voltage (VSS) line 122 by cutting both lower corners of the display panel which are parts of the inactive area IA are cut to the inside of the inactive area IA.

The notches 151 start from an end of the flexible substrate 101, and a bending process can be performed in the vicinity of the corresponding area. The bending process ends in the vicinity of the data driver IC 137, and the area of the flexible substrate 101 in which the data driver IC 137 and the pad 135 of the FPCB comes into contact with the bottom surface of the flexible substrate 101 in which the active area AA is formed. FIG. 1 illustrates the display panel 100 in which the substrate is bent using the notches 151, but the present disclosure is not limited thereto. The notches 151 may not be provided or the substrate may not be bent.

A member which is connected to the pad 135 formed on the top surface of the display panel 100 is not limited to the FPCB and various members can be connected thereto. The pad 135 may be disposed on the top surface or the bottom surface of the display panel 100.

In FIG. 1, the data driver IC 137 is disposed on the top surface of the display panel 100, but is not limited to the top surface, and the data driver IC 137 may be disposed on the bottom surface of the display panel 100.

FIG. 2 is an enlarged view of area I in FIG. 1. Referring to FIG. 2, a source voltage and various signals for driving subpixels are input to an end of the display panel 100. For example, the high-potential voltage (VDD) line 121 and the low-potential voltage (VSS) line 122 are disposed therein and the gate lines 125 and the data lines 127 for gate driving are also disposed. The lines can be provided with lighting inspection (auto probe: AP) pads corresponding to the shapes of the lines. The lighting inspection may be an auto probe inspection. In the lighting inspection, a test voltage is supplied to the lighting inspection pads which are connected to signal lines of the display panel 100 via probe pins to drive pixels of the display panel 100. An inspection signal supplied via the pads is applied to the subpixels via the lines. The lighting inspection is inspection which is performed on the display panel 100 with a glass cover attached thereto to ascertain whether the subpixels are appropriately lighted before a module process is performed. It is possible to ascertain whether a lighting defect occurs in the step of completion of the display panel 100 through the lighting inspection. Since whether a defect occurs in the display panel 100 can be ascertained before the module process is performed, it is possible to prevent failure of various components and manufacturing process losses due to a defective panel which is provided for the module process. Referring to FIG. 2, first pads 128 corresponding to the gate lines 125 and second pads 129 corresponding to the high-potential voltage (VDD) lines 121 or the low-potential voltage (VSS) lines 122 are disposed adjacent to the lines. Each first pad 128 may be a first lighting pad or a first inspection pad, and each second pad 129 may be a second lighting pad or a second inspection pad.

Figure 3A:
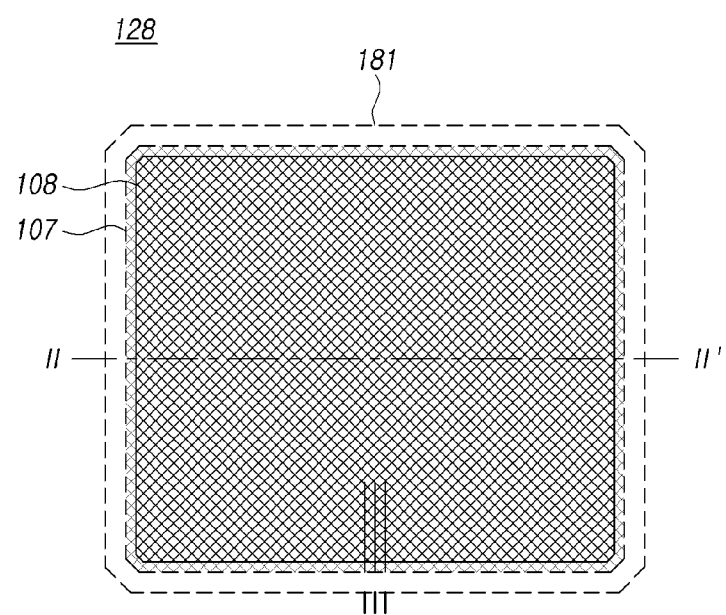
FIGS. 3A and 3B are plan views illustrating a first pad and a second pad in the display device.
Figure 3B:
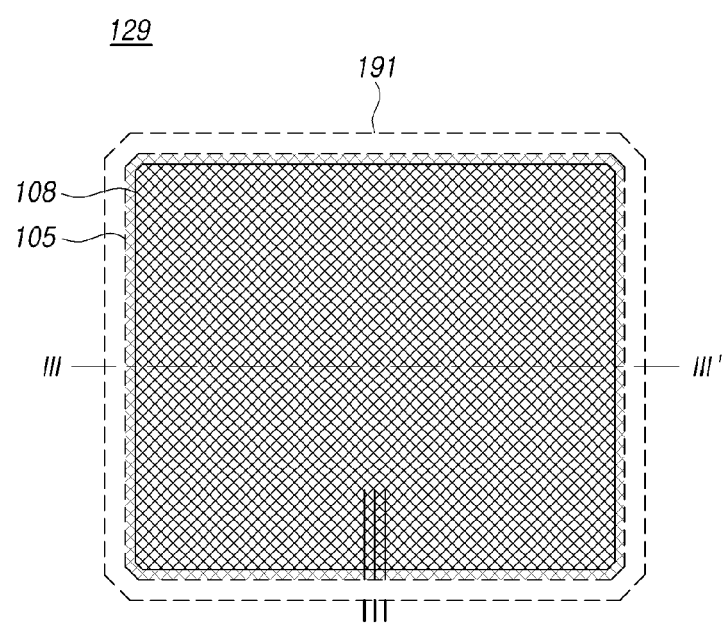

FIGS. 3A and 3B are plan views illustrating enlargement of a first pad 128 and a second pad 129 which are illustrated in FIG. 2. Referring to FIG. 3A, a first pad electrode 181 corresponding to the first pad 128 is disposed in the form of a square, and the ends of the first pad electrode 181 and a top surface adjacent thereto are covered by a passivation layer 107 and a planarization layer 108. Referring to FIG. 3B, a second pad electrode 191 is disposed in the form of a square similarly to the first pad electrode 181, and the ends of the second pad electrode 191 and a top surface adjacent thereto are covered by a first interlayer insulating layer 105 and the planarization layer 108. The two-dimensional shapes of the first pad 128 and the second pad 129 are square, but are not limited thereto and may be various shapes such as a circle and a hexagon. The first pad electrode 181 may be a first inspection electrode and the second pad electrode 191 may be a second inspection electrode.

Figure 4:
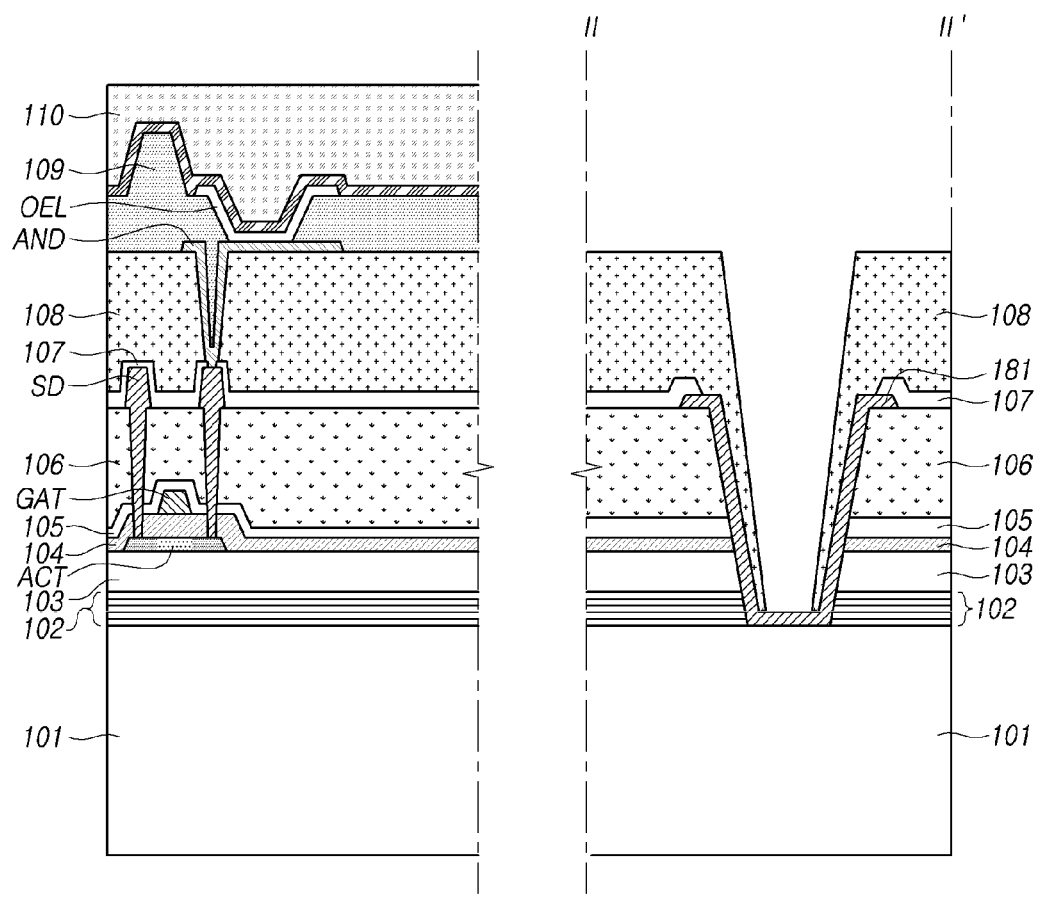
FIG. 4 is a sectional view illustrating a cross-section of the first pad and a cross-section of an active area in FIG. 3.

FIG. 4 illustrates cross-sections of a subpixel in the active area AA and the first pad 128 illustrated in FIG. 3A. Referring to FIG. 4, the substrate 101 supports various elements of the display panels 100. The substrate 101 is formed of a transparent insulating material, for example, an insulating material such as glass or plastic. When the substrate 101 is formed of plastic, the substrate 101 may be a plastic film or a plastic substrate. For example, the substrate 101 is formed of the form of a film including one of a polyimide-based polymer, a polyester-based polymer, a silicon-based polymer, an acryl-based polymer, a polyolefin-based polymer, and copolymers thereof. Among these materials, polyimide can be used for a high-temperature process and can allow coating, and thus polyimide can be mainly used for a plastic substrate.

A buffer layer 102 may be disposed on the substrate 101. The buffer layer 102 is a functional layer that serves to protect a thin-film transistor (TFT) from impurities of alkali ions which are radiated from the substrate 101. The buffer layer 102 is formed of silicon oxide (SiOx), silicon nitride (SiNx), or a multi-layered film thereof.

A thin-film transistor is disposed on the buffer layer 102. An active insulating layer 103 is disposed in the thin-film transistor to further protect the active layer. The active insulating layer 103 is formed of silicon oxide (SiOx) or silicon nitride (SiNx). A semiconductor layer ACT is disposed on the active insulating layer 103. The semiconductor layer ACT is formed of silicon semiconductor or oxide semiconductor. The silicon semiconductor includes amorphous silicon or crystallized polycrystalline silicon. Polycrystalline silicon has high mobility (100 $cm^2/Vs$ or higher), low power consumption, and excellent reliability and thus can be applied to a gate driver for a drive element and/or a multiplexer (MUX) or applied to a drive TFT in a pixel. On the other hand, oxide semiconductor has a small OFF-current and thus is suitable for a switching TFT in which an ON time is short and an OFF time is long. Since an OFF current is small and thus a voltage maintenance period of a pixel is long, oxide semiconductor is suitable for a display device requiring low-speed drive and/or low power consumption. The semiconductor layer ACT includes a drain region and a source region containing p-type or n-type impurities and forms a channel therebetween. A gate insulating layer 104 is disposed on the semiconductor layer ACT. The gate insulating layer 104 may be a single layer of silicon oxide (SiOx), silicon nitride (SiNx), or silicon oxynitride (SiON) or a multilayer thereof. A gate electrode GAT is disposed in a predetermined region of the semiconductor layer ACT, for example, at a position corresponding to the channel when impurities are implanted, on the gate insulating layer 104. The gate electrode GAT is formed of one of molybdenum (Mo), aluminum (Al), chromium (Cr), gold (AU), titanium (Ti), nickel (Ni), neodymium (Nd), and copper (CU) or an alloy thereof. The gate electrode GAT may be a multilayer which is formed of one of molybdenum (Mo), aluminum (Al), chromium (Cr), gold (AU), titanium (Ti), nickel (Ni), neodymium (Nd), and copper (CU) or an alloy thereof. For example, the gate electrode GAT is a double layer of molybdenum/aluminum-neodymium or molybdenum/aluminum. A first interlayer insulating layer 105 that insulates the gate electrode GAT is disposed on the gate electrode GAT. The first interlayer insulating layer 105 may be a single layer of silicon oxide (SiOx), silicon nitride (SiNx), or silicon oxynitride (SiON) or a multilayer thereof. A second interlayer insulating layer 106 is disposed on the first interlayer insulating layer 105. The second interlayer insulating layer 106 is formed of an organic material such as polyimide, benzocyclobutene series resin, or acrylate. Through-holes that expose a part of the semiconductor layer ACT, for example, the source region and the drain region, are disposed in some areas of the gate insulating layer 104, the first interlayer insulating layer 105, and the second interlayer insulating layer 106.

Source/drain electrodes SD are disposed on the second interlayer insulating layer 106. The source/drain electrodes SD are connected to the semiconductor layer ACT via the through-holes of the insulating layers. The source/drain electrodes SD can be a single layer or a multilayer, and are formed of one of molybdenum (Mo), aluminum (Al), chromium (Cr), gold (AU), titanium (Ti), nickel (Ni), neodymium (Nd), and copper (CU) or an alloy thereof when the source/drain electrodes SD are single layers. When the source/drain electrodes SD are multilayers, the source/drain electrodes SD are formed of a double layer of molybdenum/aluminum-neodymium or a triple layer of titanium/aluminum/titanium, molybdenum/aluminum/molybdenum, or molybdenum/aluminum-neodymium/molybdenum. Accordingly, a thin-film transistor including the active layer ACT, the gate electrode GAT, and the source/drain electrodes SD is provided. A passivation layer 107 is provided on the substrate SUB including the thin-film transistor TFT. The passivation layer 107 is an insulating layer for protecting below elements and may be a single layer of silicon oxide (SiOx), silicon nitride (SiNx), or silicon oxynitride (SiON) or a multilayer thereof. A planarization layer 108 is provided on the passivation layer 107. The planarization layer 108 is provided to remove step differences of the below structure and is formed of an organic material such as polyimide, a benzocyclobutene-based resin, or acrylate. The planarization layer 108 is formed using a method of applying the organic material in a liquid phase and then curing the organic material.

A through-hole that exposes a drain electrode is formed in a partial area of the planarization layer 108. An organic light emitting diode is disposed on the planarization layer 108. An anode electrode AND is disposed on the planarization layer 108. The anode electrode AND is a pixel electrode and is connected to a drain electrode of the thin-film transistor via the through-hole. The anode electrode AND is formed of a transparent conductive material such as indium tin oxide (ITO), indium zinc oxide (IZO), or zinc oxide (ZnO). When the anode electrode AND is a reflective electrode, the anode electrode AND further includes a reflective layer. The reflective layer is formed of aluminum (Al), copper (Cu), silver (Ag), nickel (Ni), or an alloy thereof.

A bank/spacer layer 109 that defines a pixel is disposed on the anode electrode AND. The bank/spacer layer 109 is formed of an organic material such as polyimide, a benzocyclobutene-based resin, or acrylate. An organic film layer OEL is disposed on the anode electrode AND. The organic film layer OEL is a layer in which electrons and holes are recombined to emit light, a hole injection layer or a hole transport layer is included between the organic film layer OEL and the anode electrode AND, and an electron transport layer or an electron injection layer is disposed on the organic layer OEL.

A cathode electrode CAT is disposed on the organic film layer OEL. The cathode electrode CAT is disposed on the entire surface of the display panel 100 and is formed of magnesium (Mg), calcium (Ca), aluminum (Al), silver (Ag), or an alloy thereof with a low work function. The cathode electrode CAT is formed with such a small thickness that light can be transmitted when the cathode electrode CAT is a transmissive electrode, and the cathode electrode CAT is formed with such a large thickness that light can be reflected when the cathode electrode CAT is a reflective electrode.

A capping layer and an encapsulation layer 110 is disposed on the cathode electrode CAT. The capping layer is disposed on the cathode electrode CAT and has a high refractive index. The capping layer having a high refractive index helps light generated in the organic film layer OEL be well extracted to the outside. The encapsulation layer 110 is disposed on the capping layer. The encapsulation layer 110 is provided to protect the organic film layer OEL from external moisture and oxygen. The encapsulation layer 110 has a configuration in which an inorganic insulating layer, an organic insulating layer, and an inorganic insulating layer are complexly arranged, and is provided to sufficiently cover the entire surface of the display panel 100 including the active area AA and the inactive area IA.

A cross-section of the first pad 128 taken along line II-IF in FIG. 3A is illustrated in FIG. 4. In combination with a cross-section of a subpixel, the buffer layer 102, the active insulating layer 103, the gate insulating layer 104, the first interlayer insulating layer 105, and the second interlayer insulating layer 106 are sequentially disposed on the substrate 101. The first pad electrode 181 can be formed at the same time as forming the source/drain electrodes SD after the second interlayer insulating layer 106 has been formed. In a first embodiment of the present disclosure, the first pad electrode 181 is disposed in contact with the substrate 101. For example, a via-hole may be formed to expose the substrate 101 by etching the insulating layers under the first pad electrode 181. The buffer layer 102 and the active insulating layer 103 may be first partially etched at the time of forming the semiconductor layer ACT or the gate line 125 in a subpixel of the active area AA, and the gate insulating layer 104, the first interlayer insulating layer 105, and the second interlayer insulating layer 106 which remain may be etched at the time of forming the source/drain electrodes SD. The first pad electrode 181 is disposed in contact with the substrate 101, and the passivation layer 107 is disposed to cover the peripheral side surface of the first pad electrode 181 and a part of the top surface of the peripheral portion. The planarization layer 108 is disposed on the passivation layer 107. The planarization layer 108 may be disposed to further extend to the inside of the first pad electrode 181 from the passivation layer 107 and to over the passivation layer 107. The first pad electrode 181 which is exposed from the passivation layer 107 and the planarization layer 108 is defined as a first pad 128. The reason why the insulating layers under the first pad 128 are etched and the first pad electrode 181 is disposed in direct contact with the substrate 101 is as follows. Since an organic light emitting display device is a spontaneous light emitting display without requiring a backlight, insulating layers are formed on a hard glass substrate in the stage of manufacture, but a flexible substrate 101 can be completed by removing the glass substrate thereafter. For example, a glass substrate is used in the stage of manufacture, and lighting inspection is performed on pads on the flexible substrate 101 without using the glass substrate. When an insulating layer is located under the first pad 128 disposed on the flexible substrate 101 and a metallic probe pin comes into contact with the pad for lighting inspection, the first pad 128 can be locally subjected to a strong impact. The impact applied to the first pad 128 can cause cracks in the inorganic insulating layers. When cracks are generated in the insulating layer under the first pad 128 disposed in the periphery of the display panel 100, external moisture and oxygen can permeate the active area AA through the cracks. For the purpose of preventing this problem, the buffer layer 102, the active insulating layer 103, the gate insulating layer 104, the first interlayer insulating layer 105, and the second interlayer insulating layer 106 which are disposed under the first pad 128 are etched. When the insulating layers under the first pad electrode 181 are etched and the first pad 128 is disposed in contact with the substrate 101, the substrate 101 can absorb an impact at the time of contact of a probe pin for lighting inspection with the first pad electrode 181. When the insulating layers formed of an inorganic material or an organic material such as the buffer layer 102, the active insulating layer 103, and the gate insulating layer 104 are disposed under the first pad electrode 181, cracks may be generated in the insulating layers due to a force or a load when a probe pin of lighting inspection equipment comes into contact with the first pad 128. External moisture or oxygen may permeate the display device through the cracks generated in the first pad 128. For the purpose of preventing such cracks, all the insulating layers under the first pad 128 are removed to form the first pad electrode 182. When the substrate 101 absorbs an impact of the probe pin for lighting inspection, inspection can be completed without causing cracks. The passivation layer 107 defines an area of the first pad 128 by covering the periphery of the first pad electrode 181. A peripheral uneven surface of the first pad electrode 181 which may be formed at the time of patterning the first pad electrode 181 can be covered with the passivation layer 107 such that it is not exposed. The planarization layer 108 extends to cover the passivation layer 107 and a part of the first pad electrode 181 and define the area of the first pad 128, and can prevent a phenomenon in which the passivation layer 107 disposed on the first pad electrode 181 is separated. For example, when a probe pin for lighting inspection departs from the center of the first pad 128 at the time of contact with the pad, the planarization layer 108 disposed with a large thickness in the periphery of the first pad 128 can absorb a force or an impact which may be applied to the passivation layer 107. The probe pin can be arranged at the center of the first pad 128.

Figure 5:
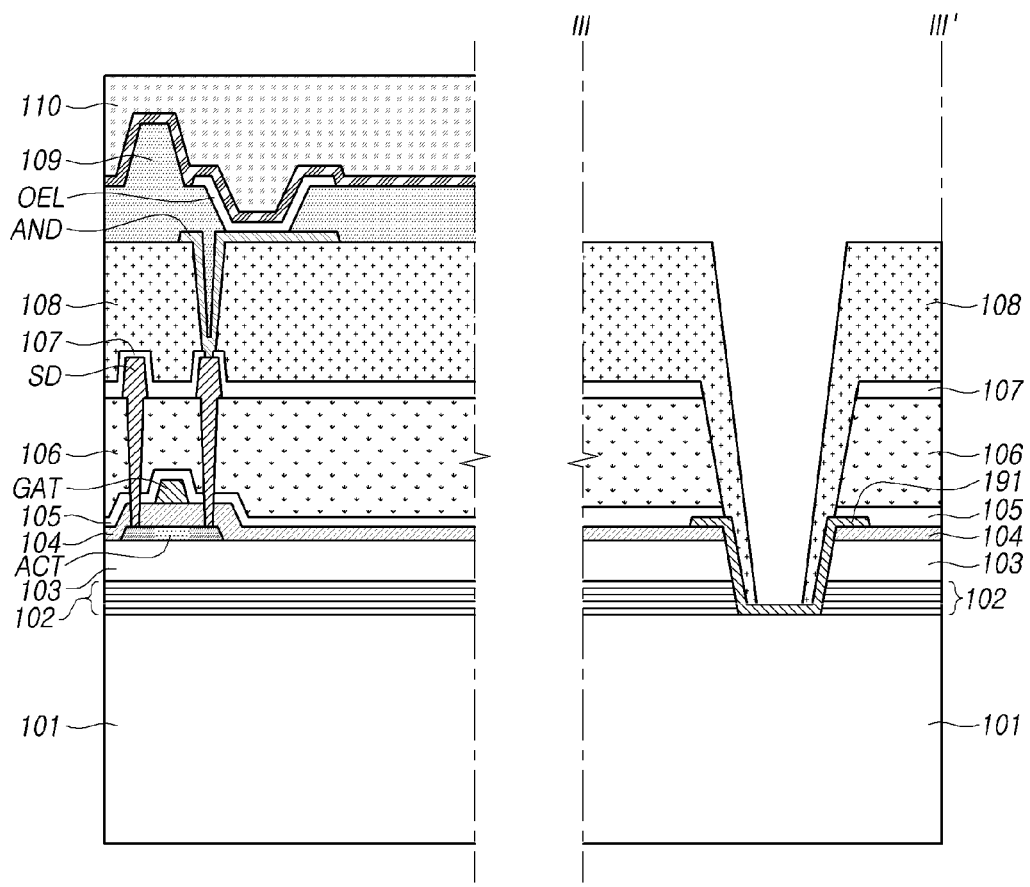
FIG. 5 is a sectional view illustrating a cross-section of the second pad and a cross-section of an active area in FIG. 3.

FIG. 5 illustrates a subpixel in an active area AA and a cross-section of the first pad 128 illustrated in FIG. 3B together. Referring to FIG. 5, the substrate 101 supports various elements of the display panel 100. The substrate 101 is formed of a transparent insulating material such as glass or plastic. When the substrate 101 is formed of plastic, the substrate 101 may be a plastic film or a plastic substrate. For example, the substrate 101 may be a film including one of a polyimide-based polymer, a polyester-based polymer, a silicon-based polymer, an acryl-based polymer, a polyolefin-based polymer, and copolymers thereof. Among these materials, polyimide is a material which can be applied to a high-temperature process and which can be coated, and thus is mainly used for a plastic substrate.

The buffer layer 102 is disposed on the substrate 101. The buffer layer 102 may be a functional layer that protects a thin-film transistor (TFT) from impurities such as alkali ions which flow out of the substrate 101. The buffer layer 102 may be formed of silicon oxide (SiOx), silicon nitride (SiNx), or a multi-layered film thereof.

A thin-film transistor is disposed on the buffer layer 102. The active insulating layer 103 is provided in the thin-film transistor to further protect an active layer. The active insulating layer 103 is formed of silicon oxide (SiOx) or silicon nitride (SiNx). The semiconductor layer ACT is disposed on the active insulating layer 103. The semiconductor layer ACT is formed of silicon semiconductor or oxide semiconductor. Silicon semiconductor includes amorphous silicon or crystallized poly-silicon. Polycrystalline silicon has high mobility (100 cm$^2$/Vs or higher), low power consumption, and excellent reliability and thus can be applied to a gate driver for a driving element and/or a multiplexer (MUX) or can be applied to a driving TFT in a pixel. On the other hand, since oxide semiconductor has a small OFF-current, oxide semiconductor can be suitably used for a switching TFT in which an ON time is short and an OFF time is long. Oxide semiconductor has a small OFF current and a long voltage retention period of a pixel, and thus can be suitably used for a display device requiring lower-speed drive and/or low power consumption. The semiconductor layer ACT includes a drain region and a source region including p-type or n-type impurities and can form a channel therebetween. The gate insulating layer 104 is disposed on the semiconductor layer ACT. The gate insulating layer 104 may be a single layer of silicon oxide (SiOx), silicon nitride (SiNx), or silicon oxynitride (SiON) or a multilayer thereof. A gate electrode GAT is disposed in a predetermined area of the semiconductor layer ACT on the gate insulating layer 104, for example, at a position corresponding to the channel which is formed when impurities have been implanted. The gate electrode GAT is formed of one of molybdenum (Mo), aluminum (Al), chromium (Cr), gold (AU), titanium (Ti), nickel (Ni), neodymium (Nd), and copper (CU) or an alloy thereof. The gate electrode GAT may be a multilayer which is formed of one of molybdenum (Mo), aluminum (Al), chromium (Cr), gold (AU), titanium (Ti), nickel (Ni), neodymium (Nd), and copper (CU) or an alloy thereof. For example, the gate electrode GAT may be a double layer of molybdenum/aluminum-neodymium or molybdenum/aluminum. The first interlayer insulating layer 105 that insulates the gate electrode GAT is disposed on the gate electrode GAT. The first interlayer insulating layer 105 may be a single layer of silicon oxide (SiOx), silicon nitride (SiNx), or silicon oxynitride (SiON) or a multilayer thereof. The second interlayer insulating layer 106 is disposed on the first interlayer insulating layer 105. The second interlayer insulating layer 106 is formed of an organic material such as polyimide, a benzocyclobutene-based resin, or acrylate. Through-holes for exposing a part of the semiconductor layer ACT, for example, the source region and the drain region, are disposed in some areas of the gate insulating layer 104, the first interlayer insulating layer 105, and the second interlayer insulating layer 106.

The source/drain electrodes SD are disposed on the second interlayer insulating layer 106. The source/drain electrodes SD are connected to the semiconductor layer ACT via the through-holes. The source/drain electrodes SD may be a single layer or a double layer, and may be formed of one of molybdenum (Mo), aluminum (Al), chromium (Cr), gold (AU), titanium (Ti), nickel (Ni), neodymium (Nd), and copper (CU) or an alloy thereof when they are single layers. When the source/drain electrodes SD are double layers, the source/drain electrodes SD may be a double layer of molybdenum/aluminum-neodymium or a triple layer of titanium/aluminum/titanium, molybdenum/aluminum/molybdenum, or molybdenum/aluminum-neodymium/molybdenum. Accordingly, a thin-film transistor including the semiconductor layer ACT, the gate electrode GAT, and the source/drain electrodes SD is provided. The passivation layer 107 is provided on the substrate SUB including the thin-film transistor TFT. The passivation layer 107 is an insulating layer for protecting below elements and may be a single layer of silicon oxide (SiOx), silicon nitride (SiNx), or silicon oxynitride (SiON) or a multilayer thereof. The planarization layer 108 is provided on the passivation layer 107. The planarization layer 108 is provided to remove step differences of the below structure and is formed of an organic material such as polyimide, a benzocyclobutene-based resin, or acrylate. The planarization layer 108 is formed using a method of applying the organic material in a liquid phase and then curing the organic material.

A through-hole that exposes a drain electrode is formed in a partial area of the planarization layer 108. An organic light emitting diode is disposed on the planarization layer 108. An anode electrode AND is disposed on the planarization layer 108. The anode electrode AND is a pixel electrode and is connected to a drain electrode of the thin-film transistor via the through-hole. The anode electrode AND is formed of a transparent conductive material such as indium tin oxide (ITO), indium zinc oxide (IZO), or zinc oxide (ZnO). When the anode electrode AND is a reflective electrode, the anode electrode AND further includes a reflective layer. The reflective layer is formed of aluminum (Al), copper (Cu), silver (Ag), nickel (Ni), or an alloy thereof.

A bank/spacer layer 109 that defines a pixel is disposed on the anode electrode AND. The bank/spacer layer 109 is formed of an organic material such as polyimide, a benzocyclobutene-based resin, or acrylate. An organic film layer OEL is disposed on the anode electrode AND. The organic film layer OEL is a layer in which electrons and holes are recombined to emit light, a hole injection layer or a hole transport layer is included between the organic film layer OEL and the anode electrode AND, and an electron transport layer or an electron injection layer is disposed on the organic layer OEL.

A cathode electrode CAT is disposed on the organic film layer OEL. The cathode electrode CAT is disposed on the entire surface of the display panel 100 and is formed of magnesium (Mg), calcium (Ca), aluminum (Al), silver (Ag), or an alloy thereof with a low work function. The cathode electrode CAT is formed with such a small thickness that light can be transmitted when the cathode electrode CAT is a transmissive electrode, and the cathode electrode CAT is formed with such a large thickness that light can be reflected when the cathode electrode CAT is a reflective electrode.

A capping layer and an encapsulation layer 110 is disposed on the cathode electrode CAT. The capping layer is disposed on the cathode electrode CAT and has a high refractive index. The capping layer having a high refractive index helps light generated in the organic film layer OEL be well extracted to the outside. The encapsulation layer 110 is disposed on the capping layer. The encapsulation layer 110 is provided to protect the organic film layer OEL from external moisture and oxygen. The encapsulation layer 110 has a configuration in which an inorganic insulating layer, an organic insulating layer, and an inorganic insulating layer are complexly arranged, and is provided to sufficiently cover the entire surface of the display panel 100 including the active area AA and the inactive area IA.

A cross-section of a second pad 129 taken along line in FIG. 3B is illustrated in FIG. 5. In combination with a cross-section of a subpixel, the buffer layer 102, the active insulating layer 103, and the gate insulating layer 104 are sequentially formed on the substrate 101. The second pad electrode 191 can be formed at the same time as forming the gate electrode GAT after the gate insulating layer 104 has been formed. In a second embodiment of the present disclosure, the second pad electrode 191 is disposed in contact with the substrate 101. For example, a via-hole may be formed to expose the substrate 101 by etching the insulating layers under the second pad electrode 191 using a particular photolithography process and a mask. The second pad electrode 191 is disposed in direct contact with the substrate 101, and the first interlayer insulating layer 105 is disposed to cover the peripheral side surface of the second pad electrode 191 and a part of the peripheral top surface thereof. The second interlayer insulating layer 106, the passivation layer 107, and the planarization layer 108 are formed on the first interlayer insulating layer 105. The planarization layer 108 may be disposed to further extend to the inside of the second pad electrode 191 from the first interlayer insulating layer 105 and to cover the first interlayer insulating layer 105, the second interlayer insulating layer 106, and the passivation layer 107. The second pad electrode 191 which is exposed from the first interlayer insulating layer 105 and the planarization layer 108 is defined as a second pad 129. The reason why the insulating layers under the second pad 129 are etched and the second pad electrode 191 is disposed in direct contact with the substrate 101 is as follows. Since an organic light emitting display device is a spontaneous light emitting display without requiring a backlight, insulating layers are formed on a hard glass substrate in the stage of manufacture, but a flexible substrate 101 can be completed by removing the glass substrate thereafter. For example, a glass substrate is used in the stage of manufacture, and lighting inspection is performed on pads on the flexible substrate 101 without using the glass substrate. When an insulating layer is located under the second pad 129 disposed on the flexible substrate 101 and a metallic probe pin comes into contact with the pad for lighting inspection, the second pad 129 can be locally subjected to a strong impact. The impact applied to the second pad 129 can cause cracks in the inorganic insulating layers. When cracks are generated in the insulating layer under the second pad 129 disposed in the periphery of the display panel 100, external moisture and oxygen can permeate the active area AA through the cracks. For the purpose of preventing this problem, the buffer layer 102, the active insulating layer 103, the gate insulating layer 104, the first interlayer insulating layer 105, and the second interlayer insulating layer 106 which are disposed under the second pad 129 are etched. When the insulating layers under the second pad electrode 191 are etched and the second pad 129 is disposed in contact with the substrate 101, the substrate 101 can absorb an impact at the time of contact of a probe pin for lighting inspection with the second pad electrode 191. When the insulating layers formed of an inorganic material or an organic material such as the buffer layer 102, the active insulating layer 103, and the gate insulating layer 104 are disposed under the second pad electrode 191, cracks may be generated in the insulating layers due to a force or a load when a probe pin of lighting inspection equipment comes into contact with the second pad 129. External moisture or oxygen may permeate the display device through the cracks generated in the second pad 129. For the purpose of preventing such cracks, all the insulating layers under the second pad 129 are removed to form the second pad electrode 191. When the substrate 101 absorbs an impact of the probe pin for lighting inspection, inspection can be completed without causing cracks. The first interlayer insulating layer 105 can define an area of the second pad 129 by covering the periphery of the second pad electrode 191. A peripheral uneven surface of the second pad electrode 191 which may be formed at the time of patterning the second pad electrode 191 can be covered with the first interlayer insulating layer 105 such that it is not exposed. The planarization layer 108 extends to cover the first interlayer insulating layer 105, the second interlayer insulating layer 106, and the passivation layer 107 and a part of the second pad electrode 191 and to define the area of the second pad 129. The planarization layer 108 can prevent a phenomenon in which the first interlayer insulating layer 105 or the passivation layer 107 disposed on the second pad electrode 191 is separated. For example, when a probe pin for lighting inspection departs from the center of the second pad 129 at the time of contact with the pad, the planarization layer 108 disposed with a large thickness in the periphery of the second pad 129 can absorb a force or an impact which may be applied to the passivation layer 107 or the first interlayer insulating layer 105. The probe pin can be arranged at the center of the second pad 129. It has been described above with reference to FIG. 2 that the first pad 128 is applied to the gate line and the second pad 129 is applied to the high-potential voltage line 121 or the low-potential voltage line 122, but the present disclosure is not limited thereto and the pads can be inversely used. One of the first pad 128 and the second pad 129 can be applied as a pad of the display panel 100.

Figure 6A:
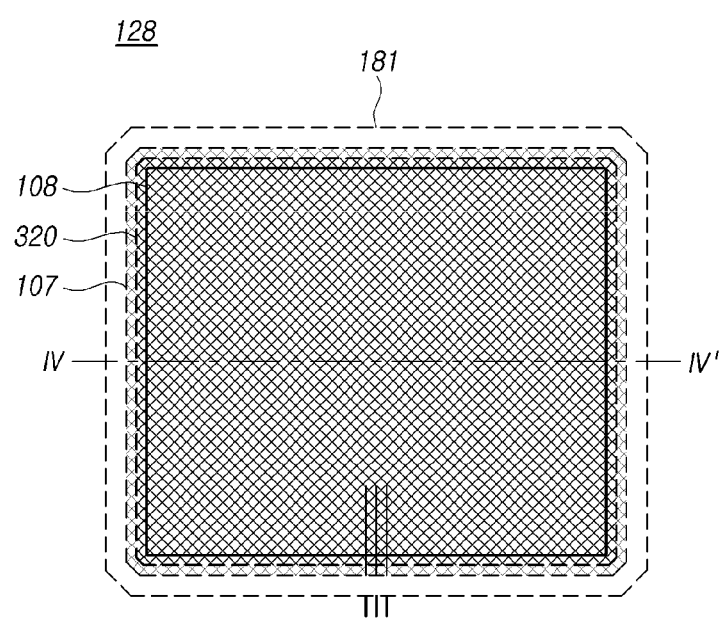
FIGS. 6A and 6B are plan views illustrating another example of the first pad and the second pad in the display device.
Figure 6B:
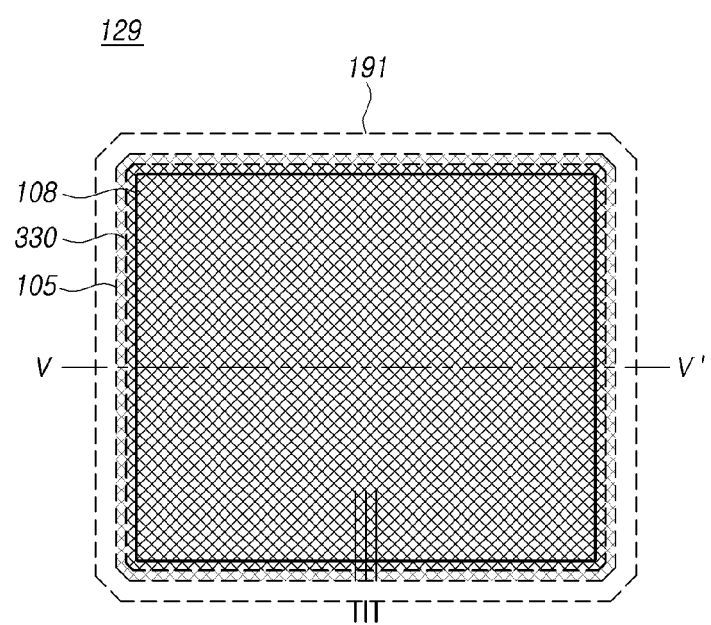

FIGS. 6A and 6B are plan views illustrating enlargements of the first pad 128 and the second pad 129 illustrated in FIG. 2. Referring to FIG. 6A, the first pad electrode 181 corresponding to the first pad 128 is disposed in a square shape, and the passivation layer 107 and the planarization layer 108 are disposed to cover the ends of the first pad electrode 181 and the periphery top thereof. The planarization layer 108 further extends to the inside of the first pad electrode 181 from the passivation layer 107 to cover a first crack stopper structure 320 disposed between the passivation layer 107 and the planarization layer 108. Referring to FIG. 6B, similarly to the first pad electrode 181, the second pad electrode 191 is disposed in a square shape, and the first interlayer insulating layer 105 and the planarization layer 108 are disposed to cover the ends of the second pad electrode 191 and the periphery top thereof. The planarization layer 108 further extends to the inside of the second pad electrode 191 from the first interlayer insulating layer 105 to cover a second crack stopper structure 330 disposed between the first interlayer insulating layer 105 and the planarization layer 108. The planar shapes of the first pad 128 and the second pad 129 are square, but the present disclosure is not limited thereto and may be circular, hexagonal, or the like.

FIG. 7 illustrates a cross-section of the first pad 128 taken along line IV-IV' in FIG. 6A. A plurality of insulating films are disposed on the substrate 101, and the first pad electrode 181 is formed at the same time as forming the source/drain electrodes SD in the active area AA. The first pad electrode 181 is formed in direct contact with the substrate 101. For example, at least a portion of the first pad electrode 181 is formed to be in direct contact with the substrate 101. The first crack stopper structure 320 is formed in an area inside the first pad electrode 181 at the time of etching the insulating films for forming the first pad electrode 181. For example, the first crack stopper structure 320 is disposed in an area between the peripheral line of the passivation layer 107 and the peripheral line of the planarization layer 108 such that the first pad 128 defined by the planarization layer 108 is surrounded. Referring to FIG. 7, the first crack stopper structure 320 includes a first wall structure 321, a second wall structure 322, and a third wall structure 323. The first to third wall structures 321 to 323 include the buffer layer 102, the active insulating layer 103, the gate insulating layer 104, the first interlayer insulating layer 105, and the second interlayer insulating layer 106. The wall structures can be formed as structures which remain by selectively etching the insulating films at the time of forming the first pad 128. The planarization layer 108 is disposed to cover the top surface and the side surface of the passivation layer 107 to prevent a phenomenon in which the passivation layer 107 is separated. The planarization layer 108 is formed to cover the first to third wall structures 321 to 323 of the first crack stopper structure 320, and thus it is possible to prevent formation of a residual film between the wall structures or invasion of foreign substance therebetween. The first crack stopper structure 320 is formed to surround the periphery of the first pad 128 and thus it is possible to prevent cracks which may be generated in the first pad 128 from being transmitted to the active area AA. A path including cracks through which external moisture or oxygen is transmitted can be clogged or delayed by the wall structures of the first crack stopper structure 320. A triple structure is exemplified as the wall structure of the first crack stopper structure 320, but the present disclosure is not limited thereto and one or more structures may be provided. It has been described above with reference to FIG. 2 that the first pad 128 is applied to the gate line and the second pad 129 is applied to the high-potential voltage line 121 or the low-potential voltage line 122, but the present disclosure is not limited thereto and the pads can be inversely used. One of the first pad 128 and the second pad 129 can be applied as a pad of the display panel 100.

Figure 8:
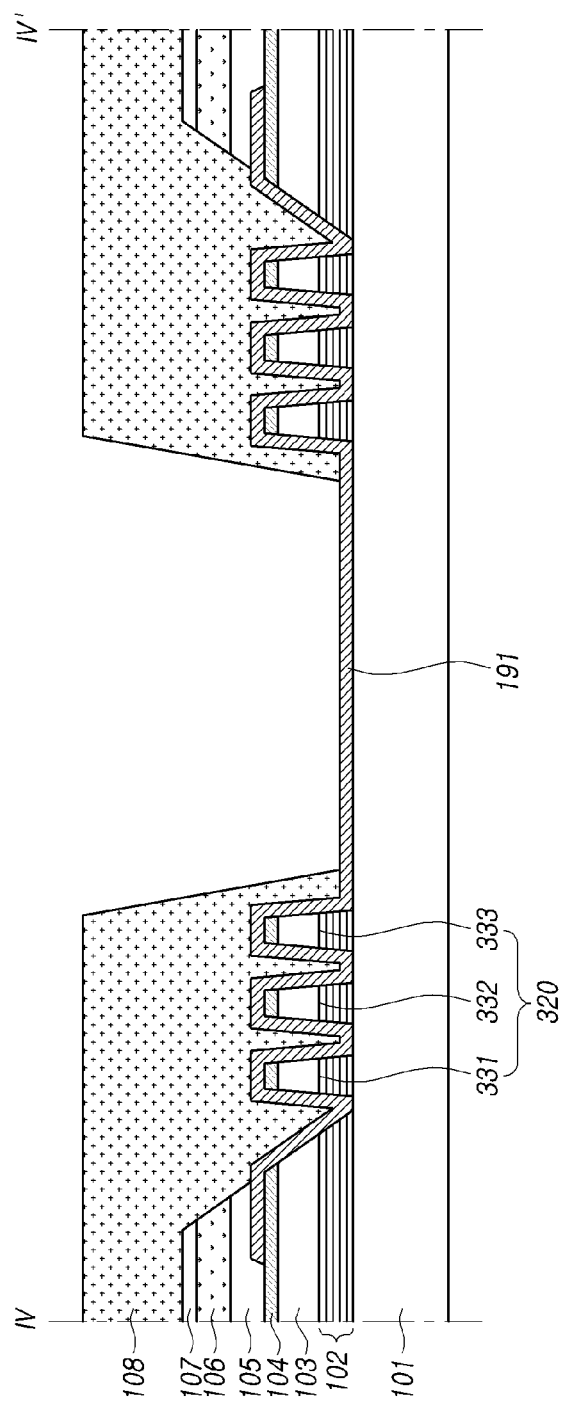
FIG. 8 is a sectional view illustrating another example of the second pad.

FIG. 8 illustrates a cross-section of the second pad 129 taken along line V-V' in FIG. 6B. A plurality of insulating films are disposed on the substrate 101, and the second pad electrode 191 is formed at the same time as forming the gate electrode GAT in the active area AA. The second pad electrode 191 is formed in direct contact with the substrate 101. For example, at least a portion of the second pad electrode 191 is formed to be in direct contact with the substrate 101. The second crack stopper structure 330 is formed in an area inside the second pad electrode 191 at the time of etching the insulating films for forming the second pad electrode 191. For example, the second crack stopper structure 330 is disposed in an area between the peripheral line of the first interlayer insulating layer 105 and the peripheral line of the planarization layer 108 such that the second pad 129 defined by the planarization layer 108 is surrounded. Referring to FIG. 8, the second crack stopper structure 330 includes a fourth wall structure 331, a fifth wall structure 332, and a sixth wall structure 333. The fourth to sixth wall structures 331 to 333 include the buffer layer 102 and the active insulating layer 103. The wall structures can be formed as structures which remain by selectively etching the insulating films at the time of forming the second pad 129. The planarization layer 108 is disposed to cover the top surface and the side surface of the first interlayer insulating layer 105 to prevent a phenomenon in which the first interlayer insulating layer 105 is separated. The planarization layer 108 is formed to cover the fourth to sixth wall structures 331 to 333 of the second crack stopper structure 330, and thus it is possible to prevent formation of a residual film between the wall structures or invasion of foreign substance therebetween. The second crack stopper structure 330 is formed to surround the periphery of the second pad 129 and thus it is possible to prevent cracks which may be generated in the second pad 129 from being transmitted to the active area AA. A path including cracks through which external moisture or oxygen is transmitted can be clogged or delayed by the wall structures of the second crack stopper structure 330. A triple structure is exemplified as the wall structure of the second crack stopper structure 330, but the present disclosure is not limited thereto and one or more structures may be provided. It has been described above with reference to FIG. 2 that the first pad 128 is applied to the gate line and the second pad 129 is applied to the high-potential voltage line 121 or the low-potential voltage line 122, but the present disclosure is not limited thereto and the pads can be inversely used. One of the first pad 128 and the second pad 129 can be applied as a pad of the display panel 100.

Examples of the display device according to the embodiment of the present disclosure include a liquid crystal display device (LCD), a field emission display device (FED), an organic light emitting display device (OLED), and a quantum dot display device.

The display device according to the embodiment of the present disclosure may be a notebook computer, a television, or a computer monitor which is a complete product or a final product including an LCM or an OLED module, an equipment display such as an automotive display or another form of a vehicle, or a set electronic device or a set device (or a set apparatus) such as a mobile electronic device such as a smartphone or an electronic pad.

The display device according to the embodiment of the present disclosure may be described as follows.

A display device according to an embodiment of the present disclosure may include: a substrate that includes an active area and an inactive area surrounding the active area; a thin-film transistor that is disposed in the active area and includes a semiconductor layer and a first electrode; and a first pad that is disposed in the inactive area and includes a first pad electrode. The first electrode and the first pad electrode are formed of the same material and therefore includes the same material.

The display device may further include an insulating film that is disposed between the first electrode and the substrate, and the first pad electrode is disposed to come into direct contact with the substrate.

In the display device, the first pad electrode may come into contact with a probe pin of lighting inspection equipment.

In the display device, the inactive area may further include a high-potential voltage line, a low-potential voltage line, and a gate line, and the first pad may be connected to at least one of the high-potential voltage line, the low-potential voltage line, and the gate line.

The display device may further include a planarization layer that is disposed in the active area and the inactive area, and the planarization layer may be disposed to cover a peripheral top of the first pad.

The display device may further include a first crack stopper structure that is disposed between an end of the planarization layer and the first pad electrode.

In the display device, the first electrode may be used as a source/drain electrode of the thin-film transistor.

In the display device, the first electrode may be used as a gate electrode of the thin-film transistor.

In the display device, the first pad electrode may be disposed on the first crack stopper structure and the planarization layer may be disposed on the first pad electrode.

A display device according to another embodiment of the present disclosure may include: a substrate that includes an active area and an inactive area surrounding the active area; a thin-film transistor that is disposed in the active area and includes a first electrode; a first inspection pad including a first inspection electrode and a second inspection pad including a second inspection electrode, the first inspection pad and the second inspection pad being disposed in the inactive area; and a planarization layer that covers the active area and at least a part of the inactive area and covers at least a part of the first inspection electrode and the second inspection electrode.

In the display device, the first electrode and the first inspection electrode or the second inspection electrode may be formed of the same material. For example, the first electrode and the first inspection electrode may be formed of the same material, or the first electrode and the second inspection electrode may be formed of the same material. In some embodiments, for example, the first electrode, the first inspection electrode, and the second inspection electrode may be formed of the same material.

In the display device, the first electrode and the first inspection electrode may be formed of the same material and the first electrode and the second inspection electrode may be formed of differential materials.

In the display device, the inactive area may further include a high-potential voltage line, a low-potential voltage line, and a gate line, the first inspection electrode may be connected to the gate line, and the second inspection electrode may be connected to the high-potential voltage line.

In the display device, the inactive area may further include a high-potential voltage line, a low-potential voltage line, and a gate line, the first inspection electrode may be connected to the gate line, and the second inspection electrode may be connected to the low-potential voltage line.

In the display device, the first inspection pad may include a first crack stopper structure, and the planarization layer may be disposed to cover the first crack stopper structure.

In the display device, the second inspection pad may include a second crack stopper structure, the second inspection electrode may be disposed on the second crack stopper structure, and the planarization layer may be disposed to cover the second crack stopper structure.

In the display device, the first inspection electrode or the second inspection electrode may be disposed to come into direct contact with the substrate.

The features, structures, effects, and the like of the present disclosure which have been described above belong to at least one example of the present disclosure, and the present disclosure is not limited to the example. The features, structures, effects, and the like of the present disclosure which have been described above in at least one example of the present disclosure can be combined and modified into other examples by those skilled in the art. Accordingly, such combinations and modifications should be construed to belong to the scope of the present disclosure.

The above description and the accompanying drawings exemplify the technical idea of the present disclosure, and various modifications and changes such as combination, separation, substitution, and alteration of configurations can be made by those skilled in the art without departing from the essential features of the disclosure. Accordingly, the embodiments disclosed in the disclosure are not to restrict the technical idea of the disclosure but to explain the technical idea of the disclosure. The technical idea of the disclosure is not limited to the embodiments. The scope of the disclosure includes all the technical ideas discussed in the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate that includes an active area and an inactive area adjacent to the active area;
   a thin-film transistor that is disposed in the active area, the thin-film transistor including a semiconductor layer and a first electrode;
   a first pad that is disposed in the inactive area, the first pad including a first pad electrode;
   a planarization layer that is disposed in the active area and the inactive area; and
   at least one insulating layer disposed between the substrate and a gate insulating layer in a first direction perpendicular to a surface of the substrate,
   wherein the first electrode and the first pad electrode include a same material, and the first pad electrode contacts the substrate through a via-hole formed in the at least one insulating layer and in the gate insulating layer, wherein the first pad electrode includes an upper portion, a lower portion contacting the substrate, and an inclined portion between the upper portion and the lower portion,
wherein the substrate includes a first portion directly contacted by the lower portion of the first pad electrode and a second portion other than the first portion,
wherein both the upper portion of the first pad electrode and the inclined portion of the first pad electrode are disposed on the at least one insulating layer and on the gate insulating layer;
wherein the at least one insulating layer is not between the lower portion of the first pad electrode and the first portion of the substrate in the first direction and the gate insulating layer is not between the lower portion of the first pad electrode and the first portion of the substrate in the first direction, and
wherein the planarization layer is disposed on the upper portion of the first pad electrode, overlaps the first portion of the substrate in the first direction, and is in direct contact with a first part of the lower portion of the first pad electrode, a second part of the lower portion of the first pad electrode being exposed from the planarization layer.

2. The display device according to claim 1, wherein the at least one insulating layer comprises a buffer layer that is disposed on the substrate, wherein the inclined portion of the first pad electrode is disposed to come into direct contact with the buffer layer.

3. The display device according to claim 1, wherein the second part of the lower portion of the first pad electrode is exposed to inspect the display device.

4. The display device according to claim 3, further comprising:
a gate line in the inactive area
wherein the first pad is connected to the gate line.

5. The display device according to claim 3, further comprising:
a high-potential voltage line in the inactive area;
a low-potential voltage line in the inactive area; and
a second pad disposed in the inactive area, the second pad including a second pad electrode,
wherein the second pad is connected to at least one of the high-potential voltage line and the low-potential voltage line.

6. The display device according to claim 1, wherein the planarization layer at least partially covers a peripheral top of the first pad.

7. The display device according to claim 6, further comprising a first crack stopper structure that is disposed between an end of the planarization layer and the first pad electrode.

8. The display device according to claim 1, wherein the first electrode is used as either a source electrode or a drain electrode of the thin-film transistor.

9. The display device according to claim 1, wherein the first electrode is used as a gate electrode of the thin-film transistor.

10. The display device according to claim 7, wherein the first pad electrode is disposed on the first crack stopper structure and the planarization layer is disposed on the first pad electrode.

11. A display device, comprising:
a substrate having thereon an active area and an inactive area adjacent to the active area;
a thin-film transistor that is disposed in the active area and includes a first electrode;
at least one insulating layer disposed between the substrate and the thin-film transistor in a first direction perpendicular to the substrate;
a first inspection pad including a first inspection electrode, wherein the first inspection pad is disposed in the inactive area;
a second inspection pad including a second inspection electrode, wherein the second inspection pad is disposed in the inactive area;
a planarization layer that covers the active area and at least a part of the inactive area and contacts at least a peripheral part of a top surface of at least one of the first and second inspection electrodes, the at least one of the first and second inspection electrodes includes a same material as the first electrode and contacts the substrate through a via-hole formed in the at least one insulating layer; and
wherein the at least one of the first and second inspection electrodes includes a corresponding upper portion, a corresponding lower portion contacting the substrate, and a corresponding inclined portion between the corresponding upper portion and the corresponding lower portion,
wherein the substrate includes a first portion directly contacted by the corresponding lower portion of the at least one of the first and second inspection electrodes and a second portion other than the first portion,
wherein both the corresponding upper portion of the at least one of the first and second inspection electrodes and the corresponding inclined portion of the at least one of the first and second inspection electrodes are disposed on the least one insulating layer;
wherein the at least one insulating layer is not between the corresponding lower portion of the at least one of the first and second inspection electrodes and the first portion of the substrate in the first direction, and
wherein the planarization layer is disposed on at least a portion of the corresponding upper portion of the at least one of the first and second inspection electrodes, overlaps the first portion of the substrate in the first direction, and is in direct contact with a first part of the corresponding lower portion of the at least one of the first and second inspection electrodes, and a second part of the corresponding lower portion is exposed from the planarization layer.

12. The display device according to claim 11, wherein the at least one of the first and second inspection electrodes is the first inspection electrode.

13. The display device according to claim 12, wherein the inactive area further includes a high-potential voltage line, a low-potential voltage line, and a gate line, and
wherein the first inspection electrode is connected to the gate line and the second inspection electrode is connected to the high-potential voltage line.

14. The display device according to claim 11, wherein the at least one of the first and second inspection electrodes is the second inspection electrode.

15. The display device according to claim 11, wherein the at least one of the first and second inspection electrodes is the first inspection electrode and the first electrode and the second inspection electrode are formed of differential materials.

16. The display device according to claim 15, wherein the inactive area further includes a high-potential voltage line, a low-potential voltage line, and a gate line, and wherein the first inspection electrode is connected to the gate line and the second inspection electrode is connected to the low-potential voltage line.

17. The display device according to claim 11, wherein the first inspection pad includes a first crack stopper structure, and
wherein the planarization layer is disposed to at least partially cover the first crack stopper structure.

18. The display device according to claim 11, wherein the second inspection pad includes a second crack stopper structure, and
wherein the planarization layer is disposed to at least partially cover the second crack stopper structure.

19. The display device according to claim 11, wherein the at least one of the first and second inspection electrodes is disposed in a hole leading to the substrate.

20. A display device, comprising:
a substrate that includes an active area and an inactive area adjacent to the active area;
a thin-film transistor that is disposed in the active area, the thin-film transistor including a semiconductor layer and a first electrode;
a first pad that is disposed in the inactive area, the first pad including a first pad electrode; and
a planarization layer that is disposed in the active area and the inactive area,
at least one insulating layer disposed between the substrate and a gate insulating layer in a first direction perpendicular to a surface of the substrate,
wherein the first electrode and the first pad electrode include a same material, and the first pad electrode contacts the substrate through a via-hole formed in the at least one insulating layer and in the gate insulating layer,
wherein the first pad electrode includes an upper portion, a lower portion contacting the substrate, and an inclined portion between the upper portion and the lower portion,
wherein the substrate includes a first portion directly contacted by the lower portion of the first pad electrode and a second portion other than the first portion,
wherein both the upper portion of the first pad electrode and the inclined portion of the first pad electrode are disposed on the at least one insulating layer and on the gate insulating layer;
wherein the at least one insulating layer is not between the lower portion of the first pad electrode and the first portion of the substrate in the first direction and the gate insulating layer is not between the lower portion of the first pad electrode and the first portion of the substrate in the first direction, and
wherein the planarization layer is disposed directly on at least respective portions of the upper portion of the first pad electrode, the lower portion of the first pad electrode, and the inclined portion of the first pad electrode, and overlaps the first portion of the substrate in the first direction.

21. A method of manufacturing a display device, comprising:
forming at least one insulating layer on a substrate;
forming a thin-film transistor on a display area of a substrate, including:
forming a semiconductor layer;
forming a gate insulating layer on the semiconductor layer, wherein the at least one insulating layer is disposed between the substrate and a gate insulating layer in a first direction perpendicular to a surface of the substrate;
forming a gate electrode on the semiconductor layer;
forming a second insulating layer on the gate electrode in a first direction; and
forming a first electrode connecting to the semiconductor layer by extending through the second insulating layer, wherein the first electrode is a first material;
forming a first pad on a non-display area of the substrate, including:
forming a first pad electrode on a portion of the second insulating layer extended from the display area, wherein the first pad electrode includes the first material, and the first pad electrode contacts the substrate through a via-hole formed in the at least one insulating layer,
wherein the first pad electrode includes an upper portion, a lower portion contacting the substrate, and an inclined portion between the upper portion and the lower portion,
wherein the substrate includes a first portion directly contacted by the lower portion of the first pad electrode and a second portion other than the first portion,
wherein both the upper portion of the first pad electrode and the inclined portion of the first pad electrode are disposed on the at least one insulating layer;
wherein the at least one insulating layer is not between the lower portion of the first pad electrode and the first portion of the substrate in the first direction and the gate insulating layer is not between the lower portion of the first pad electrode and the first portion of the substrate in the first direction, and
wherein the planarization layer is disposed on the upper portion of the first pad electrode, overlaps the first portion of the substrate in the first direction, and is in direct contact with a first part of the lower portion of the first pad electrode, a second part of the lower portion of the first pad electrode being exposed from the planarization layer.

22. The method of manufacturing a display device according to claim 21, wherein the first electrode and the first pad electrode is simultaneously formed.

* * * * *